United States Patent [19]

Chu et al.

[11] 3,881,963

[45] May 6, 1975

[54] IRRADIATION FOR FAST SWITCHING THYRISTORS

[75] Inventors: Chang K. Chu; John Bartko, both of Pittsburgh; Patrick E. Felice, Jeannette, all of Pa.

[73] Assignee: Westinghouse Electric Corporation, Pittsburgh, Pa.

[22] Filed: Jan. 18, 1973

[21] Appl. No.: 324,718

[52] U.S. Cl. .................... 148/1.5; 357/38; 357/91

[51] Int. Cl. .................... H01l 7/54

[58] Field of Search .............. 148/1.5, 1.5 C, 1.5 P; 317/235 AB

[56] References Cited

UNITED STATES PATENTS

| | | | |
|---|---|---|---|
| 2,911,533 | 11/1959 | Damask | 148/1.5 X |
| 3,209,428 | 10/1965 | Barbaro | 317/235 AB |
| 3,272,661 | 9/1966 | Tomono et al. | 148/1.5 |
| 3,400,306 | 9/1968 | Knauss | 317/234 |
| 3,448,353 | 6/1969 | Gallagher et al. | 317/235 R |
| 3,513,035 | 5/1970 | Fitzgerald et al. | 148/1.5 |
| 3,513,367 | 5/1970 | Wolley | 317/235 R |
| 3,519,899 | 7/1970 | Yamada | 317/235 R |
| 3,532,910 | 10/1970 | Lee et al. | 317/234 |

*Primary Examiner*—L. Dewayne Rutledge
*Assistant Examiner*—J. M. Davis
*Attorney, Agent, or Firm*—C. L. Menzemer

[57] ABSTRACT

The switching speed of a thyristor is increased while maintaining low gate current ($I_g$) by irradiating with a radiation source. The thyristor is irradiated preferably with electron radiation of an intensity greater than 1 Mev and most desirably 2 Mev preferably to an electron dosage of from between $1 \times 10^{13}$ and $2 \times 10^{14}$ electrons/cm$^2$.

8 Claims, 2 Drawing Figures

IRRADIATION FOR FAST SWITCHING THYRISTORS

FIELD OF THE INVENTION

The present invention relates to the manufacture of semiconductor devices and particularly fast switching thyristors.

BACKGROUND OF THE INVENTION

Nonlinear, solid state devices that are bistable, that is, they have a high and a low impedance state, are commonly referred to as thyristors. Thyristors are usually switched from one impedance state to the other by means of a control or gating signal. PNPN diodes and unijunction transistors are common thyristors. Thyristors are not, however, generally useful where fast switching and high power-high frequency signals are required. They are known for their relatively long turn-on times (i.e., time required to reach peak voltage) and their even longer turn-off time (i.e., time required for the base regions to be depleted of stored charge).

For fast switching thyristors, it is common to provide a PNPN layered structure in which the gate electrode is attached to the cathode-base region. Since devices of this type are usually fabricated of silicon and are widely used to convert AC to DC or invert DC to AC signals, they are commonly known as silicon controlled rectifiers (SCR). Such devices are also known as gate-controlled reverse-blocking thyristors.

An SCR device will remain in the "on" state even when the gate current is removed. To turn off an SCR requires reducing the anode current below that at which the product of the current gains ($\alpha$) with the device equal unity. An SCR device is therefore normally turned off by reducing or reversing the anode voltage until the current drops below the holding current value. The current during such a turn-off decays roughly according to the relation:

$$I = I_F e^{-t/\tau_p}$$

where $t$ is the time after the application of the reverse voltage;

$I_F$ is the forward current at $t = 0$; and $\tau_p$ is the minority carrier lifetime in the N-impurity base region.

From this equation it follows that the decay is highly dependent upon the minority carrier lifetime in the N-impurity base region. To obtain good forward and reverse blocking voltages, the impurity concentrations in the P-impurity base region is usually much greater than in the N-impurity base region. The result is also that good injection efficiency of P-carriers is provided in forward biasing. As a consequence, the excess charge in the P-impurity base region can be swept out, whereas the excess charge in the N-impurity base region must decay by recombination. It follows that the turn-off time of an SCR device is determined primarily by the recombination rate and in turn the minority carrier lifetime in the N-impurity base region.

In the past, the turn-off time of thyristor devices has been reduced by diffusing gold into the semiconductor body to reduce the minority carrier lifetime in the N-impurity base region. However, gold diffusion increases the gate current and in turn decreases the gate sensitivity of the device. Gold diffusion also increases the leakage current of the device. Thus, while gold diffusion may permit the device to attain faster switching, the thyristor may have limited marketability because of the need for other specified electrical characteristics.

The present invention overcomes these difficulties. It provides a thyristor with fast turn-off characteristics while maintaining the other electrical characteristics of the device.

SUMMARY OF THE INVENTION

The present invention provides a thyristor semiconductor body in which the turn-off time is decreased without significantly increasing the gate and leakage current of the device. The device is disposed with one major surface thereof adjoining the cathode-emitter region of the device exposed to a radiation source and thereafter the device is irradiated by the radiation source.

Electron radiation is preferably used as the radiation source because of availability and inexpensiveness. Moreover, electron radiation (or gamma radiation) may be preferred in some applications where the damage desired in the semiconductor lattice is to single atoms and small groups of atoms. This is in contrast to neutron and proton radiation which causes large disordered regions of as many as a few hundred atoms in the semiconductor crystal. The latter type radiation source may, however, be preferred in certain applications because of its better defined range and better controlled depth of lattice damage. It is anticipated that any kind of radiation may be appropriate provided it is capable of bombarding and disrupting the atomic lattice to create energy levels substantially decreasing carrier lifetimes without correspondingly increasing the carrier generation rate.

Electron radiation is also preferred over gamma radiation because of its availability to provide adequate dosages in a commercially practical time. For example, a $1 \times 10^{12}$ electrons/cm$^2$ dosage of 2 Mev electron radiation will result in approximately the same lattice damage as that produced by a $1 \times 10^6$ rads dosage of gamma radiation; and a $1 \times 10^{14}$ electrons/cm$^2$ dosage of 2 Mev electron radiation would result in approximately the same lattice damage as that produced by a $1 \times 10^8$ rads dosage of gamma radiation. Such dosages of gamma radiation, however, would entail several weeks of irradiation, while such dosages can be supplied by electron radiation in minutes.

Further, it is preferred that the radiation level of electron radiation be greater than 1 Mev. Lower level radiation is generally believed to result in substantial elastic collisions with the atomic lattice and, therefore, does not provide enough damage to the lattice in commercially feasible times.

To provide appropriate radiation, it has been found that radiation dosages above $1 \times 10^{13}$ electrons/cm$^2$ are preferred and that radiation dosages above $3 \times 10^{13}$ electrons/cm$^2$ are most desired. Lower dosage levels have not been found to affect significant reductions in turn-off times. Conversely, it is preferred that the radiation dosage does not exceed about $2 \times 10^{14}$ electrons/cm$^2$ so that the forward voltage drop of the thyristor can be maintained within marketably desired limits.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the preferred embodiments of the invention and present preferred methods of practicing the invention are illustrated in which.

DESCRIPTION OF THE PREFERRED EMBODIMENTS

Figure 1:
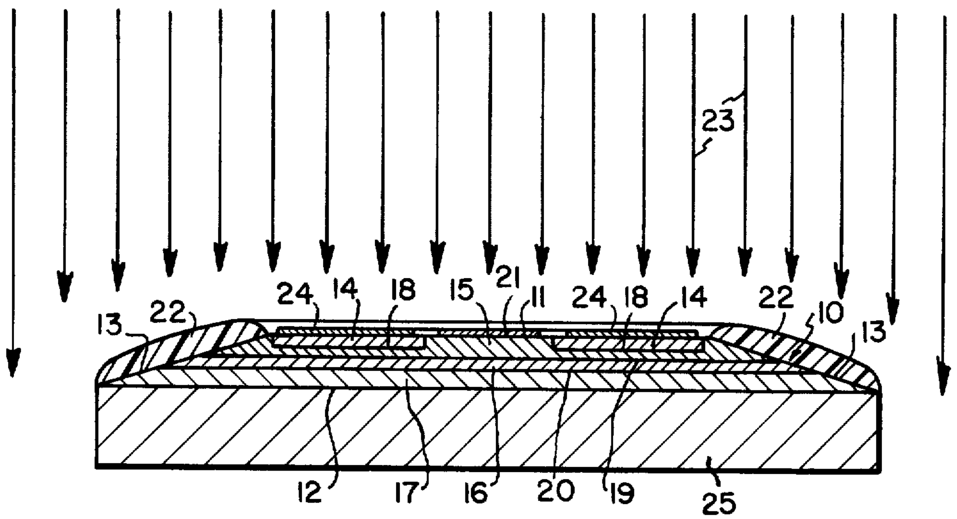
FIG. 1 is an elevational view in cross-section of a center fired thyristor being irradiated in accordance with the present invention.

Referring to FIG. 1, center fired silicon thyristor wafer or body 10 is shown having opposed major surfaces 11 and 12 and curvilinear side surfaces 13. The thyristor wafer 10 has cathode-emitter region 14 and anode-emitter region 17 of impurities of opposite conductivity type adjoining major surfaces 11 and 12, respectively, and cathode-base region 15 and anode-base region 16 of impurities of opposite conductivity type in the interior of the wafer 10 between emitter regions 14 and 17. Cathode-emitter region 14 and cathode-base region 15 are also of opposite conductivity type of impurities as is anode-base region 16 and anode-emitter region 17. By this arrangement, thyristor wafer 10 is provided with a four layer impurity structure in which three PN junctions 18, 19 and 20 are provided.

The thyristor is provided with a center fired gate by adjoining cathode-base region 15 to the major surface 11 at center portions thereof. Cathode-emitter region 14 thus extends around surface portions of region 15. To provide electrical connection to the thyristor wafer, metal contacts 21 and 24 make ohmic contact to cathode-base region 15 and cathode-emitter region 14, respectively, at major surface 11; and metal substrate 25 marks ohmic contact to anode-emitter region 17 at major surface 12. Atmospheric effects on the thyristor operation are substantially reduced by coating side surfaces 13 with a suitable passivating resin 22 such as a silicone or epoxy composition.

Figure 2:
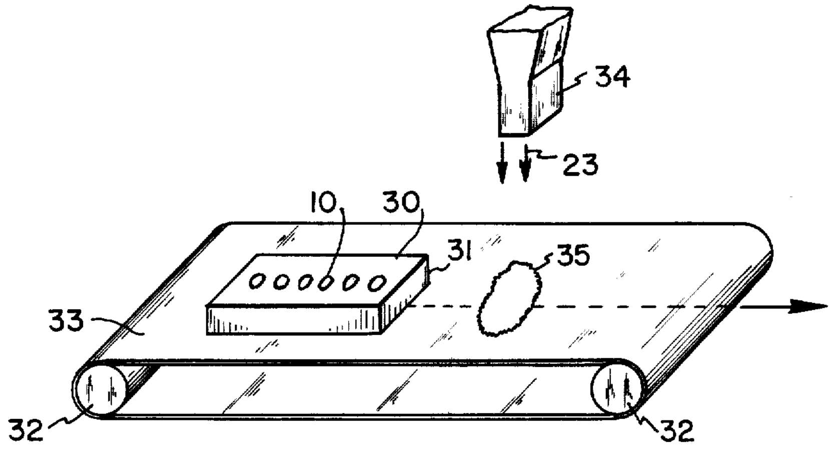
FIG. 2 is perspective view of apparatus for performance of irradiation on a series of thyristors as shown in FIG. 1.

Referring to FIG. 2, apparatus is shown for performing the irradiation on the thyristor wafer 10 as shown in FIG. 1. A conveyor belt 33 is moved around roller or pulley means 32 which are rotated by a suitable power means (not shown). A 2 Mev Van de Groff Accelerator 34 is positioned to direct electron radiation 23 perpendicular to conveyor belt 33 to strike it at 35.

Wafers 10 are positioned with major surface 11 facing upwardly as shown in FIG. 1 on a water cooled tray 30 having an electrostatically attractive periphery 31. To perform the irradiation, the electron dosage rate is measured by use of a Faraday cup in conjunction with an Elcon Charge Integrator and the radiation level adjusted to the desired dosage. Tray 30 with the wafers 10 in place are then placed on the conveyor belts 33 and moved by the conveyor in the direction of the arrow through the electron radiation 23.

By the irradiation as shown by FIGS. 1 and 2, the turn-off time of the thyristor device is typically decreased from 90 ± 10 microseconds to 25 ± 5 microseconds on an exposure $6 \times 10^{13}$ electrons/cm$^2$ without significantly increasing the gate current of the device. This increased performance has been attributed to increased minority carrier recombination rates and attendant shorter minority carrier lifetimes in the device and particularly in the N-impurity base region.

To better understand the invention, consider that the effect of irradiation is to physically damage the semiconductor lattice by displacing atoms from their normal lattice positions to other locations in the lattice and in turn creating defects in the lattice to introduce additional energy states in the energy gap between the valence and conduction energy levels. Such defects can act as additional recombination centers which cause a reduction in the minority carrier lifetime, or they may act to generate additional impurities that increase the net carrier concentration. For silicon, however, it has been found that irradiation does not increase the resistivity of the semiconductor material. It is, therefore, concluded that the energy levels introduced cause an increase in the recombination rate without significantly increasing the carrier generation rate.

Thus, irradiation effects on the silicon semiconductor device can be given by a simple equation:

$$R = R_o + \Delta R = R_o + K_T \quad \phi \qquad \text{[Eq. I]}$$

where $R_o$ is the pre-irradiation recombination rate per carrier in sec$^{-1}$;

$R$ is the post-irradiation recombination rate per carrier in sec$^{-1}$;

$\phi$ is the radiation exposure or dosage in rads (or other suitable units); and $K_T$ is the minority carrier lifetime damage factor, (rads-sec)$^{-1}$.

Further, since the recombination rate is inversely proportional to the minority carrier lifetime, this equation can be written:

$$\frac{1}{\tau} - \frac{1}{\tau_o} + K_T \ \phi \qquad \text{[Eq. II]}$$

where $\tau$ and $\tau_o$ are the post- and pre-irradiation lifetimes, respectively, in seconds.

Now, if the thyristor is considered as composed of two equivalent transistors, an N-P-N and a P-N-P, it can be calculated that the regeneration or switching will be accomplished when $$\alpha_1 \cdot \alpha_2 = 1 \text{ (or) } \frac{1}{\alpha_1} \cdot \frac{1}{\alpha_2} = 1 \qquad \text{[Eg. III]}$$

where $\alpha_1$ and $\alpha_2$ are the current gains of the equivalent transistors.

Accordingly, in light of Equation II, the increase in the recombination rate (or decrease in minority carrier lifetime) causes a change in the reciprocal emitter gain of the equivalent transistors according to the following relation:

$$\Delta \frac{1}{\alpha} = \frac{1}{\alpha} - \frac{1}{\alpha_o} = \tau_b (\Delta R') = \tau_b K' \ \phi \qquad \text{[Eq. IV]}$$

where $\tau_b$ is the base transit time in sec, $\Delta R'$ is the increase in the recombinations in the base region in rads, K' is a composite damage factor that includes the effect of recombinations in the aforementioned region in $(\text{rads-sec})^{1}$; and $\phi$ is the radiation exposure or dosage in rads.

Since the criterion for turn-on is $1/\alpha_1 \cdot 1/\alpha_2 = 1$ (Eq. III), switching after irradiation is accomplished when:

$$\left(\frac{1}{\alpha_1}+\tau_{b1}K'\phi\right)\left(\frac{1}{\alpha_2}-\tau_{b2}K'\phi\right)=1 \qquad \text{[Eq. V]}$$

If it is assumed that the minority carrier lifetime before irradiation is large compared to the lifetime after irradiation, Equation V reduces to:

$$(\tau_{b1}K'\phi)\,(\tau_{b2}K'\phi)=1 \qquad \text{[Eq. VI]}$$

Then the radiation dosage at which switching can still be induced is $$\phi=\frac{1}{K'}\left(\frac{1}{\tau_{b1}\cdot\tau_{b2}}\right)^{1/2} \qquad \text{[Eq. VII]}$$

Assuming $\tau_{b1} = 60$ ns, $\tau_{b2} = 1100$ ns ("typical" values), and $K' = 0.2$ $(\text{rads-sec})^{-1}$ then $\phi = 2 \times 10^7$ rads. This dosage represents an approximate lower limit to the dosage that would significantly affect the turn-off performance of the device.

The merits of the invention are further established by experimental observation. Thyristors tested were commercially produced silicon controlled rectifiers of 70 ampere capacity. Thyristor wafers were 0.615 inch in diameter with a cathode-emitter region, because of beveled side surfaces, of 0.460 inch in diameter. Some of these thyristors were tested without irradiation; the results are shown in Table I. Three groups of the commercially produced silicon controlled rectifiers (i.e., groups A, B and C) were irradiated with different radiation dosages and the electrical characteristics measured; the results are shown in Table II.

TABLE I

| Run No. | Gate Current (in ma) | Gate Voltage (in volts) | Holding Current (in ma) | Forward Voltage Drop in volts at 125°C | | Blocking Voltage in volts at 25°C | | Blocking Voltage in volts ma at 125°C | | Turn Off Time in μ secs 125°C |
|---|---|---|---|---|---|---|---|---|---|---|
| | | | | at 50 a | at 500 a | For.($V_{BO}$) | Rev.($V_R$) | For.($V_{BO}$) at 18 ma | Rev.($V_R$) at 30 ma | |
| 1 | 51 | 1.0 | 15 | 1.06 | 2.02 | 1200 | 1400 | 1380 | 1425 | 80–110 |
| 2 | 20 | 1.1 | 18 | — | — | 1100 | 1100 | 1200 | 1200 | 80–110 |
| 3 | 25 | 3.3 | 23 | 1.06 | 1.82 | 1100 | 1150 | 1200 | 1250 | 80–110 |
| 4 | 18 | 1.1 | 21 | 1.07 | 2.00 | 1200 | 1325 | 1350 | 1400 | 80–110 |
| 5 | 16 | 1.0 | 25 | 1.05 | 1.92 | 1100 | 1200 | 1100/5ma | 1300/5ma | 80–110 |
| 6 | 52 | 1.5 | 25 | 1.07 | 2.0 | 1000 | 1200 | 1000 | 1350 | 80–110 |
| 7 | 20 | 1.15 | 23 | 1.05 | 1.94 | 1190 | 1200 | 1250 | 1300 | 80–110 |
| 8 | 14 | 1.0 | 13 | 1.04 | 1.96 | 1200 | 1250 | 1200/5ma | 1375 | 80–110 |
| 9 | 18 | 1.1 | 23 | 1.05 | 1.79 | 1000 | 1150 | 1000/3ma | 1225 | 80–110 |
| 10 | 17 | .95 | 22 | 1.03 | 1.81 | 1300 | 1300 | 1325 | 1300 | 80–110 |
| 11 | 18 | 1.0 | 21 | 1.05 | 1.85 | 1200 | 1300 | 1375 | 1400 | 80–110 |
| 12 | 23 | 1.0 | 18 | 1.06 | 1.90 | 1050 | 1150 | 1200 | 1250 | 80–110 |
| 13 | 40 | 1.0 | 23 | 1.03 | 1.85 | 1150 | 1250 | 1300 | 1400 | 80–110 |
| 14 | 18 | 1.0 | 20 | 1.04 | 2.04 | 1200 | 1200 | 1300 | 1300 | 80–110 |
| 15 | 17 | .95 | 18 | 1.06 | 2.07 | 1100 | 1200 | 1225 | 1300 | 80–110 |
| 16 | 18 | .95 | 22 | 1.05 | 2.01 | 1200 | 1250 | 1300 | 1375 | 80–110 |
| 17 | 17 | 1.02 | 27 | 1.05 | 1.98 | 1250 | 1250 | 1300 | 1350 | 80–110 |
| 18 | 18 | 1.1 | 18 | 1.05 | 1.77 | 1250 | 1300 | 1375 | 1400 | 80–110 |
| 19 | 19 | 1.15 | 26 | 1.05 | 2.07 | 1180 | 1300 | 1300 | 1400 | 80–110 |

TABLE II

| Run No. | Radiation Dosage ($e/cm^3$) | Gate Current (in ma) | Gate Voltage (in volts) | Holding Current (in ma) | Forward Voltage Drop in volts at 125°C | | Blocking Voltage in volts at 25°C | | Blocking Voltage in volts ma at 125°C | | Turn Off Time in μ secs 125°C |
|---|---|---|---|---|---|---|---|---|---|---|---|
| | | | | | at 50 a | at 500 a | For ($V_{BO}$) | Rev. ($V_R$) | For.($V_{BO}$) at 18 ma | Rev.($V_R$) at 30 ma | |
| 1 | $3.8\times10^{13}$ (Group A) | 22 | 1.3 | 15 | 1.34 | 2.70 | 1250 | 1400 | 1400 | 1500 | >45 |
| 2 | | 24 | 1.3 | 25 | 1.35 | 2.75 | 1100 | 1150 | 1200 | 1300 | 39 |
| 3 | | 23 | 1.25 | 20 | — | — | 1100 | 1100 | 1200 | 1200 | — |
| 4 | | 20 | 1.23 | 15 | 1.35 | 2.60 | 1100 | 1250 | 1250 | 1400 | >45 |
| 5 | | 24 | 1.3 | 25 | 1.34 | 2.91 | 1100 | 1225 | 1000/5ma | 1400 | 43 |
| 6 | | 22 | 1.25 | 30 | 1.36 | 2.65 | 1200 | 1200 | 1300 | 1400 | 45 |
| 7 | | 20 | 1.23 | 15 | 1.35 | 2.45 | 1225 | 1300 | 1300/5ma | 1400 | >45 |
| 8 | $7.8\times10^{13}$ (Group B) | 26 | 1.35 | 45 | 1.55 | 3.25 | 1000 | 1200 | 950 | 1300 | >45 |
| 9 | | 26 | 1.42 | 25 | 1.55 | 3.15 | 2000 | 1700 | 1400 | 1350 | 25 |
| 10 | | 25 | 1.35 | 24 | 1.55 | 3.24 | 1250 | 1350 | 1400 | 1500 | 22 |
| 11 | | 34 | 1.65 | 25 | 1.56 | 3.52 | 1250 | 1150 | 1200 | 1300 | 20 |
| 12 | | 28 | 1.45 | 25 | 1.56 | 3.10 | 1200 | 1300 | 1350 | 1500 | 24 |
| 13 | | 26 | 1.3 | 25 | 1.56 | 3.34 | 1200 | 1225 | 550/5ma | 1400 | 20 |
| 14 | $1.17\times10^{14}$ (Group C) | 30 | 1.5 | 15 | 2.12 | too high to measure | 1100 | 1200 | 1250 | 1375 | 16 |

TABLE II-Continued

| Run No. | Radiation Dosage (e/cm³) | Gate Current (in ma) | Gate Voltage (in volts) | Holding Current (in ma) | Forward Voltage Drop in volts at 125°C at 50 a | Forward Voltage Drop in volts at 125°C at 500 a | Blocking Voltage in volts at 25°C For ($V_{BO}$) | Blocking Voltage in volts at 25°C Rev. ($V_R$) | Blocking Voltage in volts ma at 125°C For.($V_{BO}$) at 18 ma | Blocking Voltage in volts ma at 125°C Rev.($V_R$) at 30 ma | Turn Off Time in μ secs 125°C |
|---|---|---|---|---|---|---|---|---|---|---|---|
| 15 | | 32 | 1.5 | 25 | 2.06 | too high to measure | 1200 | 1300 | 1350 | 1440 | 15 |
| 16 | | 28 | 1.4 | 25 | 1.74 | too high to measure | 1300 | 1325 | 1400 | 1400 | 16 |
| 17 | | 26 | 1.32 | 25 | 1.75 | too high to measure | 1300 | 1400 | 1400 | 1500 | 16 |
| 18 | | 29 | 1.45 | 45 | 1.90 | too high to measure | 1200 | 1325 | 1375 | 1450 | 14 |
| 19 | | 34 | 1.5 | 20 | 1.90 | too high to measure | 1200 | 1300 | 1350 | 1425 | 16 |

As shown by Tables I and II, reduction of greater than one-half in turn-off time was achieved at a radiation dosage of about $1 \times 10^{13}$ electrons/cm²; and a reduction of greater than two-thirds in turn-off time was achieved at radiation dosages above about $8 \times 10^{13}$ electrons/cm². Further, the gate current remained substantially stable at all radiation dosages tested. Forward voltage drop, however, increased significantly, particularly at radiation dosage of about $2 \times 10^{14}$ electrons/cm² and greater.

Further, since an objective of this invention is to reduce the turn-off time without harmful reduction in gate sensitivity, we can select a particular radiation exposure dosage to tailor a particular time - off time for the device by monitoring the holding current. The holding current is the lowest anode current at which the device will remain in the "on" state. An approximate equation for turn-off time as a function of minority carrier lifetime, forward current and holding current is:

$$t_{off} \simeq \tau \ln \frac{I_F}{I_H} \quad \text{[Eq. VIII]}$$

Below the holding current the product of the equivalent transistor gains will drop below a value of unity resulting in a switch to the "off" state. The holding current is also a function of irradiation. Therefore, since $I_F$ is essentially constant and changes of $\tau$ with irradiation are readily established, the turn-off time can be predicted by accurate reading of changes in holding current.

While presently preferred embodiments have been shown and described, it is distinctly understood that the invention may be otherwise variously performed within the scope of the following claims.

What is claimed is:

1. A method of decreasing the turn-off time of thyristor without significantly effecting other electrical characteristics thereof comprising the steps of:
   a. positioning a thyristor semiconductor body with a major surface thereof to be exposed to a radiation source; and
   b. thereafter irradiating the thyristor semiconductor body with the radiation source to a dosage level corresponding to less than $2 \times 10^{14}$ electrons/cm² with 2 Mev electron radiation.

2. A method of decreasing the turn-off time of a thyristor as set forth in claim 1 wherein:
   the radiation source is electron radiation.

3. A method of decreasing the turn-off time of a thyristor as set forth in claim 2 wherein:
   the electron radiation has an intensity greater than 1 Mev.

4. A method of decreasing the turn-off time of a thyristor as set forth in claim 1 wherein:
   the dosage level corresponds to greater than $1 \times 10^{13}$ electrons/cm² with 2 Mev electron radiation.

5. A method of decreasing the turn-off time of a thyristor as set forth in claim 1 wherein:
   the dosage level corresponds to greater than $3 \times 10^{13}$ electrons/cm² with 2 Mev electron radiation.

6. A method of decreasing the turn-off time of a thyristor as set forth in claim 3 wherein:
   the dosage level corresponds to between $1 \times 10^{13}$ and $2 \times 10^{14}$ electrons/cm² with 2 Mev electron radiation.

7. A method of decreasing the turn-off time of thyristors as set forth in claim 6 wherein:
   the dosage level corresponds to less than $8 \times 10^{13}$ electrons/cm² with 2 Mev electron radiation.

8. A method of decreasing the turn-off time of thyristors as set forth in claim 1 wherein:
   the dosage level corresponds to less than $8 \times 10^{13}$ electrons/cm² with 2 Mev electron radiation.

* * * * *